United States Patent
Shin et al.

(10) Patent No.: US 10,490,551 B2
(45) Date of Patent: Nov. 26, 2019

(54) SEMICONDUCTOR DEVICES

(71) Applicant: Samsung Electronics Co., Ltd., Suwon-si, Gyeonggi-do (KR)

(72) Inventors: Hong-Shik Shin, Hwaseong-si (KR); Tae-Gon Kim, Seoul (KR); Yuichiro Sasaki, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/869,227

(22) Filed: Jan. 12, 2018

(65) Prior Publication Data
US 2019/0057966 A1    Feb. 21, 2019

(30) Foreign Application Priority Data
Aug. 17, 2017 (KR) .................. 10-2017-0104160

(51) Int. Cl.
*H01L 27/092* (2006.01)
*H01L 21/8238* (2006.01)
(Continued)

(52) U.S. Cl.
CPC ...... *H01L 27/092* (2013.01); *H01L 21/02532* (2013.01); *H01L 21/266* (2013.01); *H01L 21/26513* (2013.01); *H01L 21/823807* (2013.01); *H01L 21/823814* (2013.01); *H01L 21/823828* (2013.01); *H01L 21/823864* (2013.01); *H01L 21/823878* (2013.01); *H01L 29/0649* (2013.01); *H01L 29/0847* (2013.01); *H01L 29/1033* (2013.01); *H01L 29/1054* (2013.01); *H01L 29/161* (2013.01);
(Continued)

(58) Field of Classification Search
CPC ............. H01L 27/092; H01L 21/02532; H01L 21/26513; H01L 21/266; H01L 21/823807; H01L 21/823814; H01L 21/823828; H01L 21/823864; H01L 21/823878; H01L 29/0649; H01L 29/0847; H01L 29/1033; H01L 29/165; H01L 29/167; H01L 29/66545
See application file for complete search history.

(56) References Cited

U.S. PATENT DOCUMENTS 8,450,165 B2    5/2013    Bohr
8,703,568 B2    4/2014    Babcock et al.
(Continued)

OTHER PUBLICATIONS

P.A. Clifton, A.G. O'Neill, "Simulation Standard—Blaze Simulation of SiGe: Si Heterostructure p-MOSFETs", Department of Electrical and Electronic Engineering, University of Newcastle, UK, https://dynamic.silvaco.com/dynamicweb/silen/).
(Continued)

*Primary Examiner* — Thanh T Nguyen
(74) *Attorney, Agent, or Firm* — Myers Bigel, P.A.

(57) ABSTRACT

A semiconductor device includes: a substrate including a field region that defines an active region; source/drain regions in the active region; a channel region between the source/drain regions; a lightly doped drain (LDD) region between one of the source/drain regions and the channel region; and a gate structure disposed on the channel region. An upper portion of the active region may include an epitaxial growth layer having a larger lattice constant than silicon (Si), and the source/drain regions and the LDD region may be doped with gallium (Ga).

11 Claims, 8 Drawing Sheets

(51) Int. Cl.

| | | |
|---|---|---|
| *H01L 29/10* | (2006.01) | |
| *H01L 29/78* | (2006.01) | |
| *H01L 29/167* | (2006.01) | |
| *H01L 29/06* | (2006.01) | |
| *H01L 29/165* | (2006.01) | |
| *H01L 21/02* | (2006.01) | |
| *H01L 21/265* | (2006.01) | |
| *H01L 21/266* | (2006.01) | |
| *H01L 29/08* | (2006.01) | |
| *H01L 29/66* | (2006.01) | |
| *H01L 29/161* | (2006.01) | |

(52) U.S. Cl.
CPC .......... *H01L 29/165* (2013.01); *H01L 29/167* (2013.01); *H01L 29/6659* (2013.01); *H01L 29/7833* (2013.01); *H01L 29/66545* (2013.01)

(56) References Cited

U.S. PATENT DOCUMENTS

| | | |
|---|---|---|
| 9,159,786 B2 | 10/2015 | Chen |
| 9,362,285 B2 | 6/2016 | Basker et al. |
| 9,406,777 B2 | 8/2016 | Lee et al. |
| 2006/0124961 A1* | 6/2006 | Sakaguchi ........ H01L 21/76259 257/192 |
| 2010/0032727 A1* | 2/2010 | Bu ........................ H01L 21/187 257/255 |
| 2010/0032748 A1* | 2/2010 | Edwards ........ H01L 21/823814 257/327 |
| 2013/0249012 A1* | 9/2013 | Xu ........................ H01L 21/265 257/369 |
| 2014/0264484 A1 | 9/2014 | Sassiat et al. |
| 2015/0111358 A1 | 4/2015 | Pillarisetty et al. |
| 2016/0372547 A1 | 12/2016 | Glass et al. |
| 2017/0012124 A1 | 1/2017 | Glass et al. |
| 2017/0162694 A1* | 6/2017 | Basker ................ H01L 29/7848 |
| 2017/0229545 A1* | 8/2017 | Balakrishnan ...... H01L 29/1054 |

OTHER PUBLICATIONS

Weihao Weng, Claude Ortolland; Nanoscale Quantitative Characterization of 22nm CMOS Transistor Using Scanning Transmision Electron Microscopy (STEM). The 16th European Microscopy Congress 2016, Lyon, France. http://emc-proceedings.com/abstract/nanoscale-quantitative-characterization-of-22nm-cmos-transistor-using-scanning-transmission-electron-microscopy-stem/. Accessed: Aug. 22, 2017.

Saumitra Mehrotra et al., Multi-Gate FETs, "SiGe Si Material for PMOS Application" The Nanoelectronic Modeling Group, https://engineering.purdue.edu/gekcogrp/science-applications/ultra-scaled-FETs/mugfets/cmos/, Accessed: Jan. 12, 2018.

* cited by examiner

SEMICONDUCTOR DEVICES

CROSS-REFERENCE TO RELATED APPLICATION

This application claims the benefit of Korean Patent Application No. 10-2017-0104160, filed on Aug. 17, 2017, in the Korean Intellectual Property Office, the disclosure of which is incorporated by reference herein in its entirety for all purposes.

TECHNICAL FIELD

The present disclosure relates to semiconductor devices, and more particularly, to semiconductor devices that may have improved mobility characteristics of a carrier in channel regions thereof.

BACKGROUND

As the electronics industry has been rapidly developed and as user demand increases, electronic devices are becoming smaller and lighter. Semiconductor devices having a high degree of integration are desirable for use in electronic devices, and therefore design rules for elements of semiconductor devices have been reduced. Also, demand for high-speed semiconductor devices is gradually increasing. Various research has been carried out in part to satisfy demands for a high degree of integration and a high speed of semiconductor devices.

SUMMARY

The present disclosure provides semiconductor devices that may have improved mobility characteristics of a carrier in channel regions thereof.

According to an aspect of the present disclosure, a semiconductor device is provided. The semiconductor device may include: a substrate having a field region that defines an active region; source/drain regions in the active region; a channel region between the source/drain regions; a lightly doped drain (LDD) region between one of the source/drain regions and the channel region; and a gate structure disposed on the channel region. An upper portion of the active region may include an epitaxial growth layer having a larger lattice constant than silicon (Si), and the source/drain regions and the LDD region may be doped with gallium (Ga).

According to another aspect of the present disclosure, a semiconductor device is provided. The semiconductor device may include: a substrate having first and second transistor regions and formed of a first material; a first active region formed in the first transistor region; and a second active region formed in the second transistor region and including source/drain regions and a channel region. An upper region of the first active region may include a first epitaxial growth layer including the first material, and an upper portion of the second active region may include a second epitaxial growth layer that includes a second material in excess of 50 atomic percent (at %). The second material may be different from the first material, the source/drain regions may be doped with gallium (Ga), and a top surface of each of the first and second active regions may be flat.

According to another aspect of the present disclosure, a semiconductor device is provided. The semiconductor device may include: an active region having a channel region and source/drain regions doped with gallium (Ga); a channel silicon germanium (c-SiGe) layer that constitutes an upper portion of the active region and includes Ge in excess of 50 atomic percent (at %); and a gate structure disposed on the channel silicon germanium (c-SiGe) layer that includes a high-k gate insulating layer and a metal gate electrode.

BRIEF DESCRIPTION OF THE DRAWINGS

Aspects of the present disclosure may be more clearly understood from the following detailed description taken in conjunction with the accompanying drawings in which.

DETAILED DESCRIPTION

Hereinafter, aspects of the present disclosure will be described in detail with reference to the attached drawings.

FIGS. 1 through 11 are cross-sectional views for describing a method of manufacturing a semiconductor device, according to aspects of the present disclosure.

Figure 1:
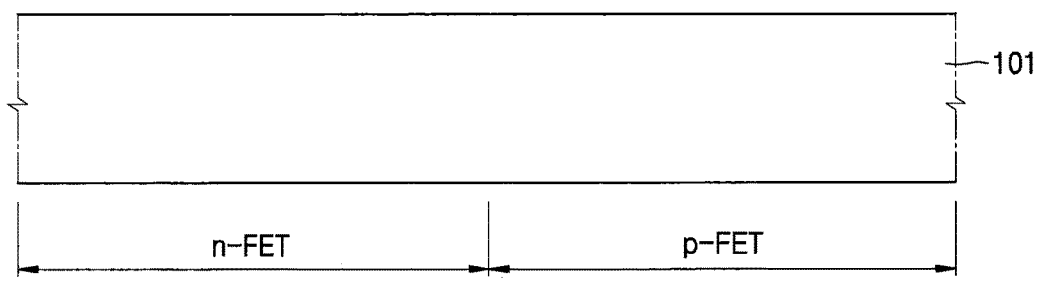
FIGS. 1 through 11 are cross-sectional views for describing a method of manufacturing a semiconductor device, according to aspects of the present disclosure.

Referring to FIG. 1, a substrate 101 may include a first transistor region n-FET and a second transistor region p-FET.

The substrate 101 may include silicon (Si), for example, crystalline silicon (Si), polycrystalline silicon (Si), or amorphous silicon (Si). In other embodiments, the substrate 101 may include a compound semiconductor, such as germanium (Ge), silicon germanium (SiGe), silicon carbide (SiC), gallium arsenide (GaAs), indium arsenide (InAs), or indium phosphide (InP). In some embodiments, the substrate 101 may include a conductive region, for example, a well doped with an impurity or a structure doped with an impurity. Hereinafter, in the current example embodiment, the substrate 101 is a Si substrate.

The substrate 101 may include the first transistor region n-FET and the second transistor region p-FET. A plurality of semiconductor devices may be in each of the first transistor region n-FET and the second transistor region p-FET. As will be described below, semiconductor devices that are on the substrate 101 may be electrically separated from each other by a device isolation layer (e.g., device isolation layer 131 of FIG. 4).

The first transistor region and the second transistor region may be defined relative to each other. That is, when the first transistor region is an n-FET region, the second transistor region may be a p-FET region. Alternatively, when the first transistor region is a p-FET region, the second transistor region may be an n-FET region. Hereinafter, in the current example embodiment, the second transistor region is a p-FET region.

Figure 2:
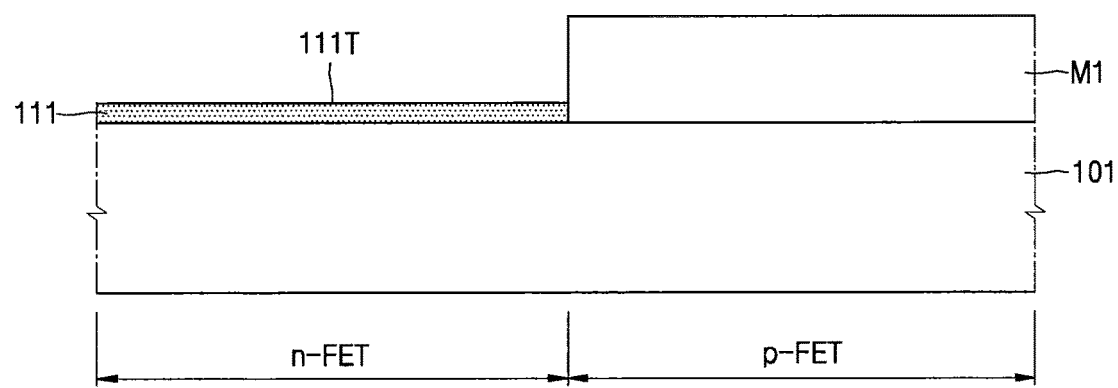

Referring to FIG. 2, a first semiconductor layer 111 may be formed on the first transistor region n-FET. A first mask pattern M1 may be formed on the second transistor region p-FET.

The first semiconductor layer 111 may be formed on the first transistor region n-FET and may be silicon (Si) grown from Si atoms that constitute the substrate 101 using an epitaxial growth process, silicon germanium (SiGe), or any material suitable for a semiconductor device. Hereinafter, in the current example embodiment, the first semiconductor layer 111 is a Si layer.

Thus, a lattice structure of a channel region of a semiconductor device in the first transistor region n-FET may be determined by a lattice structure of the substrate 101 and a lattice structure of the first semiconductor layer 111. Meanwhile, an epitaxial growth process may be performed so that there may be no lattice defect or a minimum lattice defect with the substrate 101.

Because the first mask pattern M1 is formed in the second transistor region p-FET, Si epitaxial growth may be inhibited/prevented in the second transistor region p-FET such that Si epitaxial growth may be selectively performed in the first transistor region n-FET.

The first semiconductor layer 111 is grown to minimize a defect and to maximize strain. The first semiconductor layer 111 forms upper portions of active regions (e.g., active region AR of FIG. 4) in a subsequent process.

A level of a top surface 111T of the first semiconductor layer 111 may or not match with a level of a top surface of the substrate 101 considering a subsequent process. A position of the top surface 111T of the first semiconductor layer 111 may be adjusted according to a level of difficulty caused by a difference in topology between the first transistor region n-FET and the second transistor region p-FET to be performed in the subsequent process.

Figure 3:
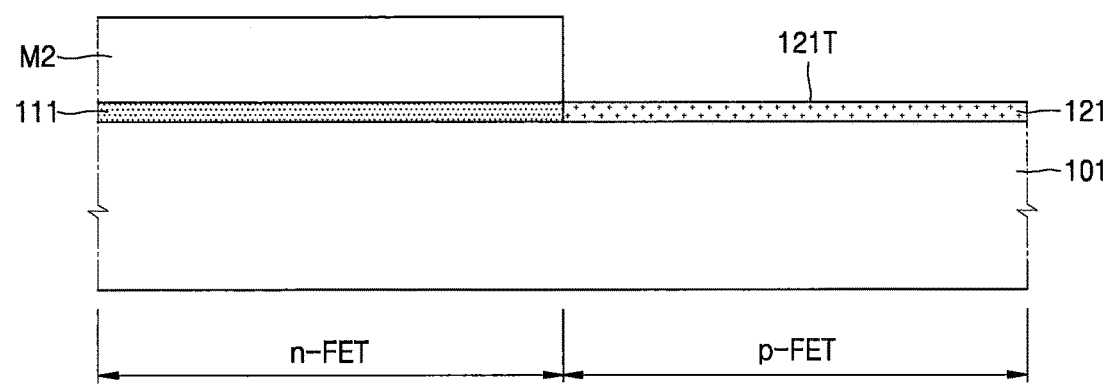

Referring to FIG. 3, after the first mask pattern (e.g., first mask pattern M1 of FIG. 2) is removed, a second semiconductor layer 121 may be formed in the second transistor region p-FET using a second mask pattern M2 formed on the first semiconductor layer 111.

The second semiconductor layer 121 may be formed in the second transistor region p-FET and may be Si grown from Si atoms that constitute the substrate 101 using an epitaxial growth process, SiGe, or any material suitable for a semiconductor device. Hereinafter, in the current example embodiment, the second semiconductor layer 121 is a SiGe layer.

Thus, a lattice structure of a channel region of a semiconductor device in the second transistor region p-FET may be determined by the lattice structure of the substrate 101 and the second semiconductor layer 121. A channel region of the second transistor region p-FET may include Ge atoms that exceed 50 atomic percent (which may be referred to herein as at %). Meanwhile, dangling bonds that affect channel current characteristics may be in the channel region of the second transistor region p-FET. Thus, an epitaxial growth process may be performed so that there may be no lattice defect or a minimum lattice defect with the substrate 101.

Because the second mask pattern M2 is formed in the first transistor region n-FET, SiGe epitaxial growth may be prevented in the first transistor region n-FET such that SiGe epitaxial growth may be selectively performed in the second transistor region p-FET.

The second semiconductor layer 121 may be grown to minimize a defect and to maximize strain. The second semiconductor layer 121 constitutes upper portions of active regions (see AR of FIG. 4) in a subsequent process. Because in a p-type transistor mobility of holes that are carriers in the channel region affects characteristics of a device, a method of applying strain to the channel region may be used.

SiGe has a larger lattice constant than Si. Strain occurs due to stress caused by mismatch of lattice constants and thus, mobility characteristics of holes may be improved. The strain may be fully reserved or may be partially released while a subsequent process is performed.

A top surface 121T of the second semiconductor layer 121 may or may not match with the top surface of the substrate 101 considering the above-described process. A position of the top surface 121T of the second semiconductor layer 121 may be adjusted according to a level of difficulty of a process caused by a difference in topology between the second transistor region p-FET and the first transistor region n-FET performed in the above-described process.

Figure 4:
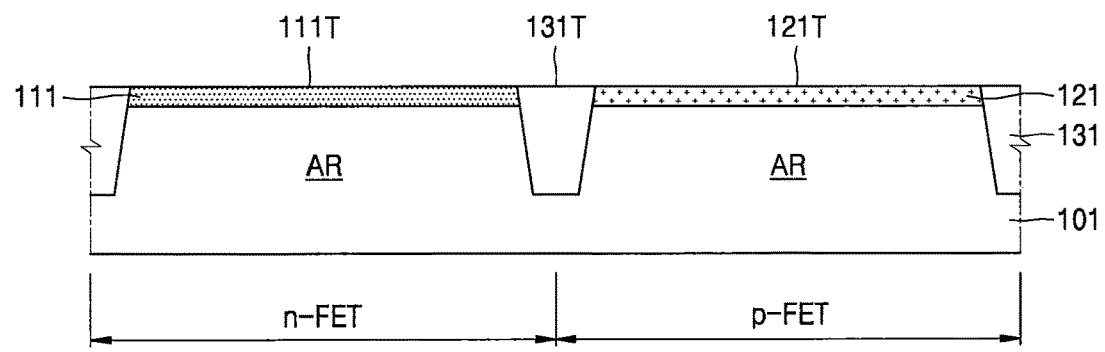

Referring to FIG. 4, after a second mask pattern (e.g., second mask pattern M2 of FIG. 3) is removed, the active regions AR of the substrate 101 may be electrically separated from each other by a device isolation layer 131.

The device isolation layer 131 may include one insulating layer but may include an outer insulating layer and an inner insulating layer. The outer insulating layer and the inner insulating layer may be formed of different materials. For example, the outer insulating layer may include an oxide layer, and the inner insulating layer may include a nitride layer. However, a configuration of the device isolation layer 131 is not limited to the above description. For example, the device isolation layer 131 may include a multi-layer including a combination of at least three types of insulating layers.

Each of the first transistor region n-FET and the second transistor region p-FET may include the active regions AR in which a semiconductor device is formed. The device isolation layer 131 may define each active region AR. The first transistor region n-FET and the second transistor region p-FET may be separated from each other by the device isolation layer 131. That is, the device isolation layer 131 may be referred to as a field region. Also, the device isolation layer 131 may be a shallow trench isolation region.

According to the present disclosure, a level of the top surface 121T of the second semiconductor layer 121 that constitutes upper portions of the active regions AR of the second transistor region p-FET may be substantially the same as a level of a top surface 131T of the device isolation layer 131. Also, the level of the top surface 111T of the first semiconductor layer 111 may be substantially the same as the level of the top surface 131T of the device isolation layer 131. That is, the levels of the top surfaces of the first semiconductor layer 111, the second semiconductor layer 121, and the device isolation layer 131 may be the same or may be substantially the same.

Figure 5:
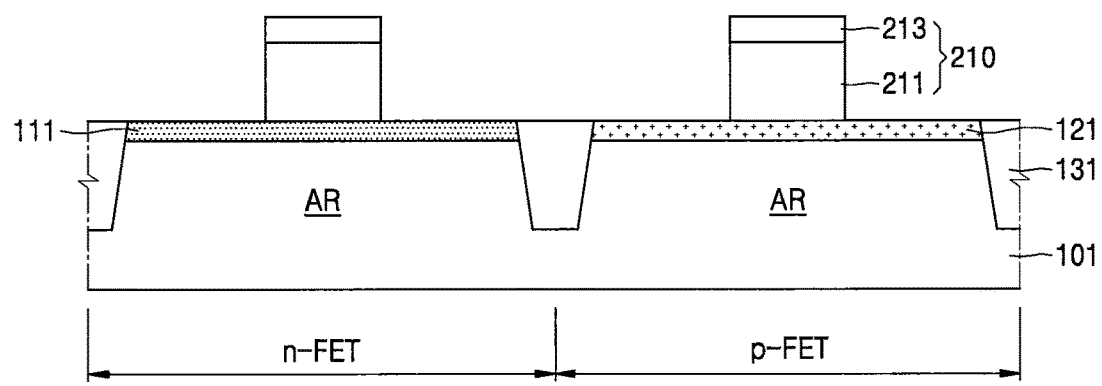

Referring to FIG. 5, a plurality of dummy gate structures 210 may be formed to form a replacement metal gate of a gate last scheme-applied device.

The plurality of dummy gate structures 210 may be formed using a process of forming a plurality of dummy gates 211 and a process of forming gate masks 213 on top surfaces of the plurality of dummy gates 211.

A method of forming the plurality of dummy gate structures 210 will now be described in greater detail.

A dummy gate-forming layer may be formed on the first semiconductor layer 111 and the second semiconductor layer 121, and a gate mask-forming layer may be formed on the dummy gate forming layer. A mask pattern for forming the plurality of dummy gates 211 and the gate mask 213 may be formed on the gate mask-forming layer. The gate mask-forming layer and the dummy gate-forming layer may be etched using the mask pattern as an etching mask so that the plurality of dummy gate structures 210 including the plurality of dummy gates 211 and the gate mask 213 may be formed on the first semiconductor layer 111 and the second semiconductor layer 121.

The plurality of dummy gates 211 having the same widths and heights may be formed on the first semiconductor layer 111 and the second semiconductor layer 121. However, the present disclosure is not limited thereto, and the plurality of dummy gates 211 having different widths and heights may be formed.

The dummy gates 211 may be formed of Si, for example. In detail, the dummy gates 211 may be formed of polysilicon, amorphous silicon, or a combination thereof. Polysilicon may be formed using chemical vapor deposition (CVD), and amorphous silicon may be formed using sputtering, CVD, plasma deposition, and the like. However, the present disclosure is not limited thereto. Hereinafter, in the current example embodiment, the dummy gates 211 are formed of polysilicon.

The dummy gates 211 may have the same widths in the same region. Alternatively, the dummy gates 211 may have different widths even in the same region according to purposes thereof. Although, in the drawings, the dummy gates 211 having the same widths are formed on the first semiconductor layer 111 and the second semiconductor layer 121, the present disclosure is not limited thereto.

The gate mask 213 may include a silicon oxide layer, a silicon nitride layer, a silicon oxynitride layer, or a combination thereof, for example. The gate mask 213 may be formed using CVD. Hereinafter, in the current embodiment, each of the gate masks 213 includes a silicon nitride layer.

The width and height of each of the gate masks 213 may vary according to the dummy gates 211. The larger the widths of the dummy gates 211, the larger the widths of the gate masks 213.

The gate masks 213 may have the same heights in the same region. Alternatively, the gate masks 213 may have different heights even in the same region. Although the drawings illustrate that gate masks 213 having the same heights are formed on the first semiconductor layer 111 and the second semiconductor layer 121, the present disclosure is not limited thereto.

Figure 6:
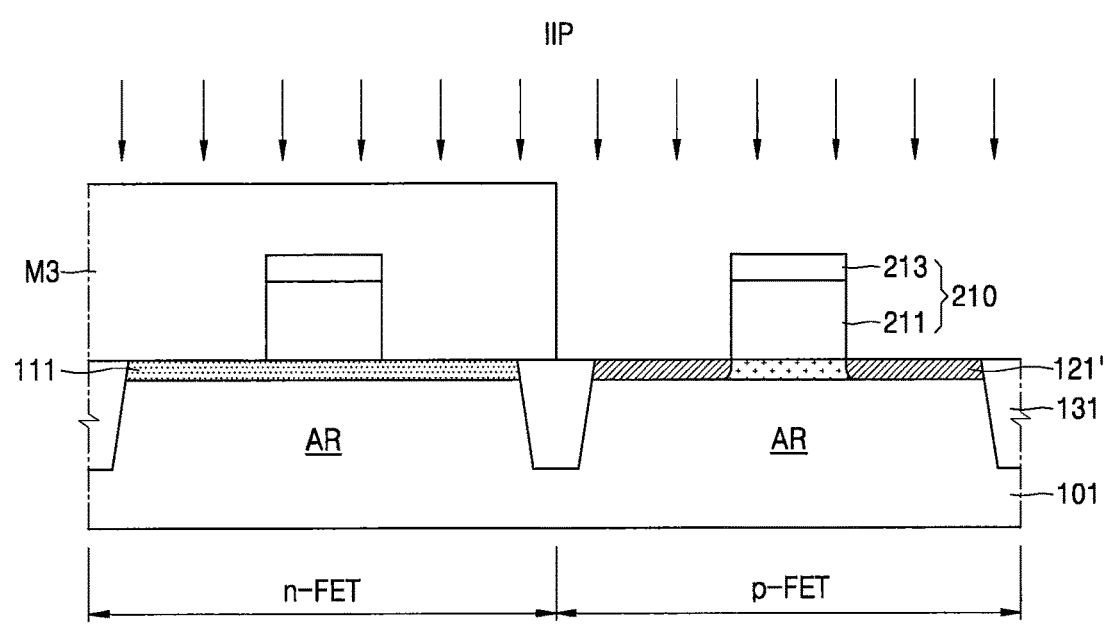

Referring to FIG. 6, a p-type lightly doped drain (LDD) region 121' may be formed by ion implanting gallium (Ga) with an impurity.

As an integration of the semiconductor device increases, a size of a transistor that constitutes an integrated circuit may be also gradually reduced. Thus, the channel length of the transistor may be reduced, and a short channel effect that deteriorates characteristics of the transistor may occur. The short channel effect may occur due to drain induced barrier lowering (DIBL), punch through, or the hot carrier effect.

The hot carrier effect is a phenomenon that, as a distance between a source and a drain is reduced, a carrier emitted from the source is rapidly accelerated by a high electric field near edges of the drain so that a hot carrier is generated and characteristics of the transistor are deteriorated by the hot carrier. An LDD region may be used to improve deterioration of the transistor due to the hot carrier.

A method of forming the p-type LDD region 121' is described in more detail herein. First, a third mask pattern M3 that covers the first transistor region n-FET may be formed. The third mask pattern M3 may be formed using an exposure and development process. Subsequently, Ga may be injected into an exposed region as an impurity using the third mask pattern M3 and the dummy gate structure 210 on the second semiconductor layer 121 as a blocking mask of ion implantation (IIP). IIP may be performed using ion implantation equipment, and a tilt of IIP that is an angle formed with the top surface of the substrate 101 may be in the range of about 30° to about 90°.

Although not shown, halo ion implantation with an n-type impurity may be performed before or after the p-type LDD region 121' is formed. An opposite type of an impurity to the transistor is used in halo ion implantation. Halo ion implantation may be effective in preventing punch through.

According to aspects of the present disclosure, a dose of Ga in the p-type LDD region 121' may be about 1E13 to 2E15 atoms/cm$^2$. As stoichiometry of Ge in SiGe that constitutes the second semiconductor layer 121 is increased, the p-type LDD region 121' is doped with Ga having a high degree of electrical activation compared to boron (B) so that speed characteristics of a p-type transistor may be improved. When Ga having a relatively high degree of activation is used in the second semiconductor layer 121, a low resistance compared to the case where B having the same dose as that of Ga is injected, may be implemented so that speed characteristics of the p-type transistor may be improved. This will be described in detail with reference to FIG. 12.

Figure 7:
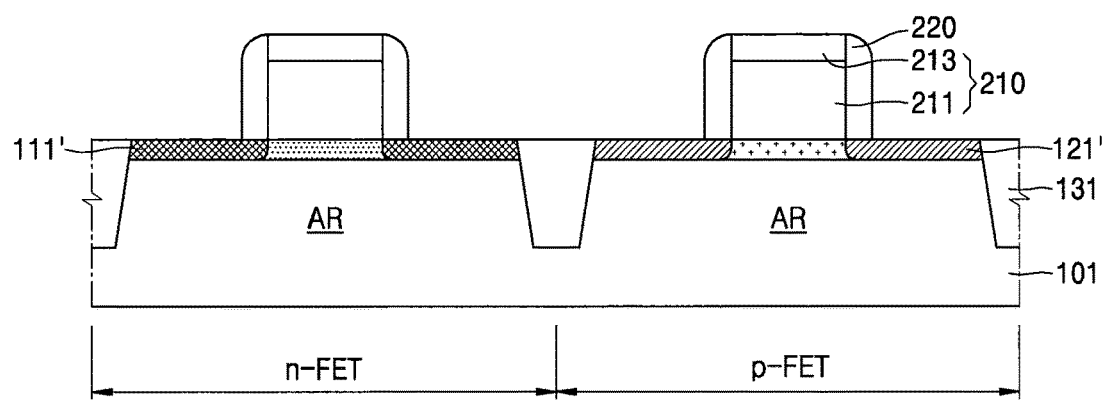

Referring to FIG. 7, after the third mask pattern (e.g., third mask pattern M3 of FIG. 6) is removed, an n-type LDD region 111' may be formed by performing ion implantation with an n-type impurity on the first transistor region n-FET, and a spacer 220 may be formed at both sidewalls of each of the plurality of dummy gate structures 210.

A process of forming the n-type LDD region 111' may be similar to a process of forming a p-type LDD region 121' in the second transistor region p-FET. However, one difference is that an n-type impurity may be implanted into the second transistor region p-FET. The n-type impurity may be a Group V element, for example. The process of forming the n-type LDD region 111' may be modified by those skilled in the art as described with reference to FIG. 6. Thus, a detailed description thereof will be omitted.

Although not shown, before or after the n-type LDD region 111' is formed, halo ion implantation may be performed with the p-type impurity. An opposite type of impurity to that of the transistor may be used in halo ion implantation.

After the n-type LDD region 111' and the p-type LDD region 121' are formed, the spacer 220 may be formed at both sides of each of the plurality of dummy gate structures 210. The spacer 220 may be formed of at least one selected from the group consisting of silicon oxide, silicon nitride, and silicon oxynitride. In the current example embodiment, the spacer 220 includes a single layer. However, the present disclosure is not limited thereto, and the spacer 220 may also include a double layer or a triple layer.

Figure 8:
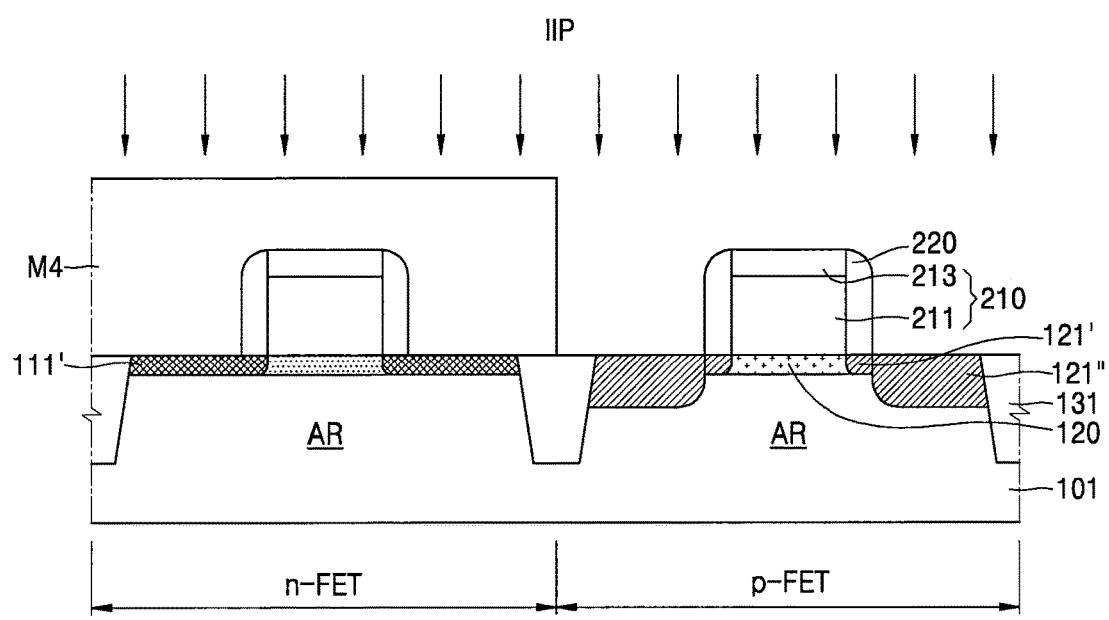

Referring to FIG. 8, a p-type source/drain region 121" may be formed by ion implanting Ga as an impurity into the second transistor region p-FET.

A method of forming the p-type source/drain region 121" will now be described in more detail.

First, a fourth mask pattern M4 may be formed to cover the first transistor region n-FET. The fourth mask pattern M4 may be formed using an exposure and development process. Subsequently, Ga that is an impurity is implanted into an exposed region using the fourth mask pattern M4, the dummy gate structures 210 disposed on the second semiconductor layer 121, and the spacer 220 formed at both sidewalls of each of the dummy gate structures 210 as a blocking mask for IIP. IIP may be performed using ion implantation equipment, and a tilt of IIP that is an angle formed with the top surface of the substrate 101 may be in the range of about 70° to about 90°.

According to aspects of the present disclosure, a dose of Ga in the p-type source/drain region 121" may be 5E13 to 5E15 atoms/cm². The dose of Ga in the p-type source/drain region 121" may be higher than a dose of Ga in the p-type LDD region 121'.

As stoichiometry of Ge in SiGe that constitutes the second semiconductor layer 121 is increased, the p-type source/drain region 121" may be doped with Ga having a high degree of electrical activation compared to B so that speed characteristics of the p-type transistor may be improved. The p-type source/drain region 121" may be formed on not only the second semiconductor layer 121 but also a portion of the substrate 101. That is, an upper portion of the p-type source/drain region 121" may be an epitaxial growth layer of SiGe that includes Ge in excess of 50 atomic percent, and the other portion of the p-type source/drain region 121" may be Si.

When Ga having a relatively high degree of activation is used in the second semiconductor layer 121, for example, in the upper portion of the p-type source/drain region 121", a low resistance compared to the case where B having the same dose as that of Ga is injected, may be implemented so that speed characteristics of the p-type transistor may be improved. This will be described in detail with reference to FIG. 12 below.

The p-type source/drain region 121" may be formed within the substrate 101 at both sides of the spacer 220, and a p-type channel region 120 between the p-type source/drain regions 121" may be defined under the dummy gate structure 210.

The p-type channel region 120 may be in the second semiconductor layer 121. That is, the p-type channel region 120 may be an epitaxial growth layer of SiGe that includes Ge in excess of 50 atomic percent. In other words, the p-type channel region 120 may be in a channel silicon germanium (c-SiGe) layer. Also, a p-type LDD region 121' may be on both sides of the p-type channel region 120. Because a region in which the p-type LDD region 121' and the p-type source/drain region 121" overlap each other, is defined as a p-type source/drain region 121", the p-type LDD region 121' may be only on both sides of the p-type channel region 120.

Figure 9:
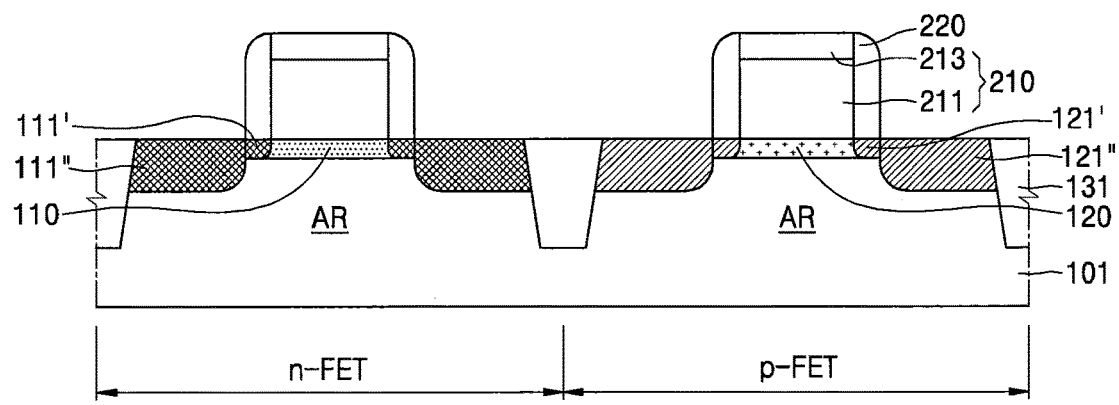

Referring to FIG. 9, after a fourth mask pattern (e.g., fourth mask pattern M4 of FIG. 8) is removed, an n-type source/drain region 111" may be formed by ion implanting an n-type impurity into the first transistor region n-FET.

A process of forming the n-type source/drain region 111" may be similar to a process of forming the p-type source/drain region 121" in the second transistor region p-FET. However, the only difference is that an n-type impurity is implanted into the second transistor region p-FET. The n-type impurity may be a Group V element. The process of forming the n-type source/drain region 111" may be modified by those skilled in the art as described with reference to FIG. 8 and thus, a detailed description thereof will be omitted.

The n-type source/drain region 111" may be formed on not only the first semiconductor layer 111 but also a portion of the substrate 101. That is, an upper portion of the n-type source/drain region 111" may be an epitaxial growth layer of Si, and the other portion of the n-type source/drain region 111" may also be Si.

The n-type source/drain region 111" may be formed within the substrate 101 at both sides of the spacer 220, and an n-type channel region 110 between the n-type source/drain regions 111" may be defined under the dummy gate structure 210.

The n-type channel region 110 may be in the first semiconductor layer 111. That is, the n-type channel region 110 may be an epitaxial growth layer of Si. In other words, the n-type channel region 110 may be in a channel silicon (c-Si) layer. Also, an n-type LDD region 111' may be on both sides of the n-type channel region 110. A region, in which the n-type LDD region 111' and the n-type source/drain region 111" overlap each other, may be defined as an n-type source/drain region 111". That is, the n-type LDD region 111' may be only on both sides of the n-type channel region 110.

After impurity doping is performed on the n-type and p-type LDD regions 111' and 121' and the n-type and p-type source/drain regions 111" and 121", the substrate 101 may be annealed at about 650 to 1050° C. for about 5 to 240 seconds so as to cure damage caused by impurity implantation. The time and temperature are not limited to the above numerical values.

Figure 10:
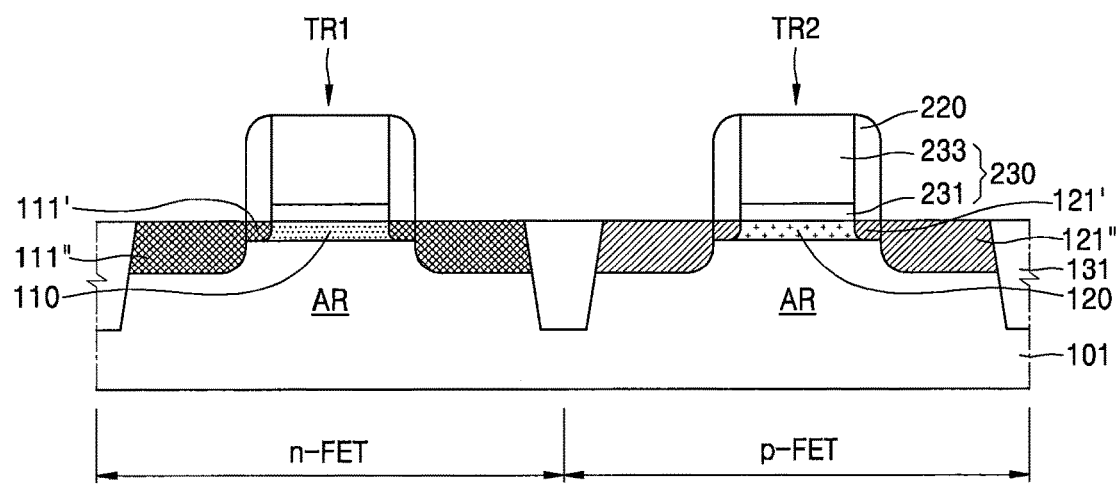

Referring to FIG. 10, the plurality of dummy gate structures (see 210 of FIG. 9) may be removed to form a plurality of gate structures 230.

A method of forming the plurality of gate structures 230 will now be described in more detail herein.

First, an etching process of removing the plurality of dummy gate structures (see 210 of FIG. 9) may be a wet etching process using ammonia, tetramethyl ammonium hydroxide (TMAH) and/or tetraethylammonium hydroxide (TEAH), for example. However, the present disclosure is not limited thereto.

An interface layer (not shown) and a gate insulating layer 231 may be formed within a trench in which top surfaces of the n-type channel region 110 and the p-type channel region 120 are exposed.

The interface layer may prevent interface defects between the gate insulating layer 231 formed thereon and the lower, first and second semiconductor layers (e.g., semiconductor layers 111 and 121 of FIG. 5). The interface layer may be a silicon oxide layer, a silicon oxynitride layer, a silicate layer, or a combination thereof, for example. In some embodiments, a process of forming the interface layer is omittable or may be omitted.

The gate insulating layer 231 may be formed using atomic layer deposition (ALD) chemical oxidation. The gate insulating layer 231 may include a high-k dielectric material. The high-k dielectric material may be a material having a higher dielectric constant than that of a silicon oxide layer.

The high-k dielectric material may be include at least one selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

A gate electrode 233 may be formed on the gate insulating layer 231. The gate electrode 233 may include titanium, titanium nitride, tantalum, tantalum nitride, tungsten, copper, aluminum, or a mixture thereof. A process, such as ALD, metal organic ALD (MOALD), CVD, metal organic CVD (MOCVD), or physical vapor deposition (PVD) may be used to form the gate electrode 233. However, the present disclosure is not limited thereto.

In some embodiments, when the gate electrode 233 is formed, in order to improve the reliability of the high-k dielectric material that constitutes the gate insulating layer 231 and a metal layer stack structure that constitutes the gate electrode 233, after a partial metal layer that constitutes the metal layer sack structure that constitutes the gate electrode 233 is formed on the gate insulating layer 231, a polysilicon sacrificial layer for thermal treatment may be formed thereon, and a resultant structure thereof may be thermally treated and then the polysilicon sacrificial layer for thermal treatment may be removed again. Subsequently, another metal layer may be formed on the thermally-treated partial metal layer so that the gate electrode 233 may be formed.

Each of an n-type transistor TR1 and a p-type transistor TR2 including the plurality of gate structures 230 and the spacer 220 may have a planar structure. That is, the first and second semiconductor layers (e.g., semiconductor layers 111 and 121 of FIG. 5) formed on the substrate 101 may be substantially formed flat, and the n-type and p-type transistors TR1 and TR2 may be formed thereon.

Figure 11:
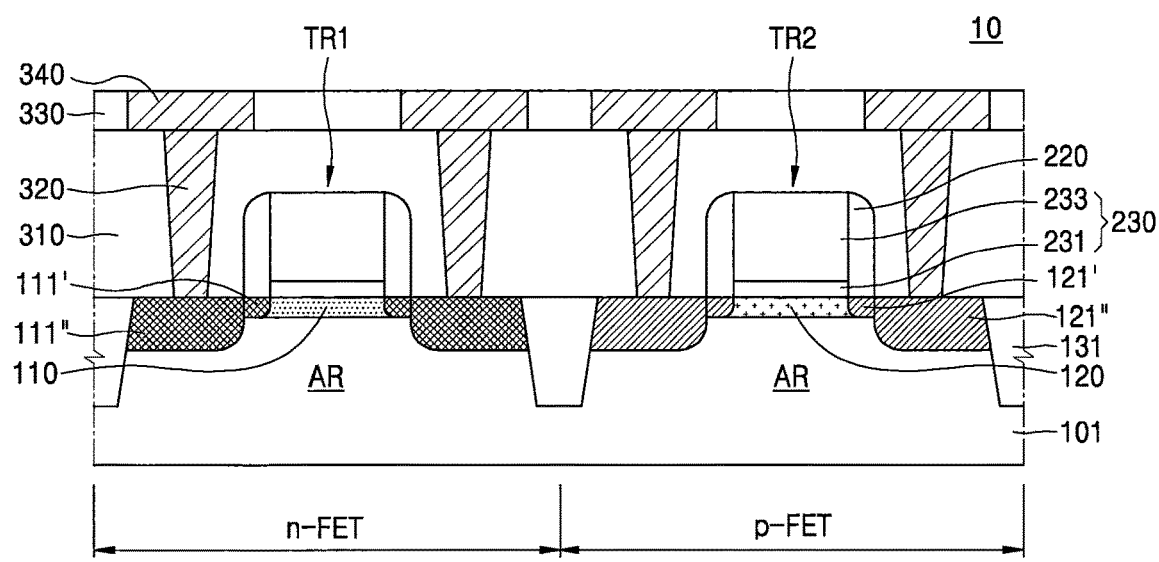

Referring to FIG. 11, a semiconductor device 10 may include a contact plug 320 and a conductive line 340.

An intermetallic insulating layer 310 may be formed on the plurality of gate structures 230 and the spacer 220. The intermetallic insulating layer 310 may include a silicon oxide layer, a silicon nitride layer, or a combination thereof. The contact plug 320 may penetrate the intermetallic insulating layer 310 and thus may be in direct contact with the n-type and p-type source/drain regions 111" and 121".

A method of forming the contact plug 320 will now be described in more detail herein.

A mask pattern (not shown) may be formed on the intermetallic insulating layer 310. The mask pattern may cover a portion of the intermetallic insulating layer 310 that excludes a region in which a contact hole is to be formed. After the mask pattern (not shown) is formed on the intermetallic insulating layer 310, the portion of the intermetallic insulating layer 310 may be etched using the mask pattern as an etching mask so that the contact hole may be formed. The n-type and p-type source/drain regions 111" and 121" may be exposed through the contact hole.

A conductive barrier layer (not shown) that covers inner walls of the contact hole may be formed. A conductive material may be filled in the conductive barrier layer so that the contact plug 320 may be formed.

Subsequently, an interlayer insulating layer 330 and a conductive line 340 may be formed on top surfaces of the intermetallic insulating layer 310 and the contact plug 320. In some embodiments, the contact plug 320 and the conductive line 340 may be formed using a damascene process or a dual damascene process. The processes may be performed by those skilled in the art in a process of forming a semiconductor device and thus, a detailed description thereof will be omitted.

Through these processes, aspects of the present disclosure provide the semiconductor device 10 having improved speed characteristics of the p-type transistor TR2.

Figure 12:
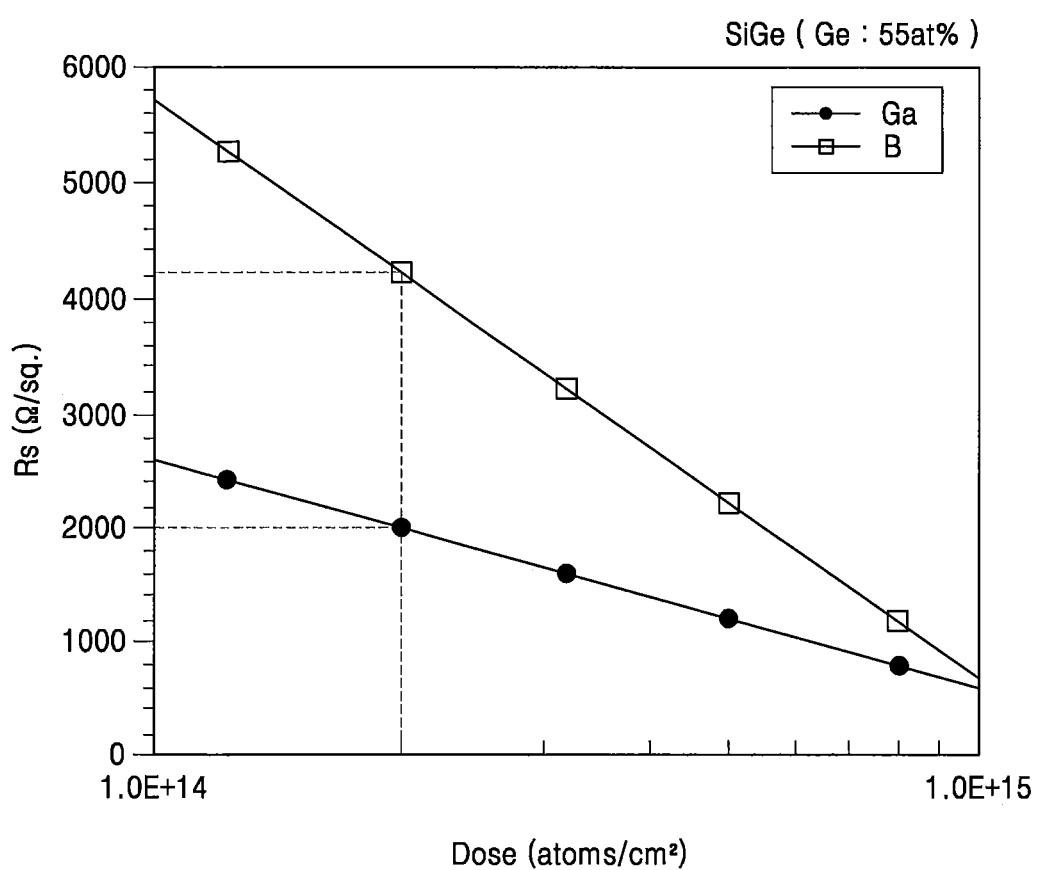
FIG. 12 is a graph showing a sheet resistance versus a dose of an impurity used in the semiconductor device according to aspects of the present disclosure.

FIG. 12 is a graph showing a sheet resistance versus a dose of an impurity used in the semiconductor device according to aspects of the present disclosure.

Referring to FIG. 12, a sheet resistance Rs is shown according to a dose of B and Ga with respect to SiGe that includes Ge of about 55 at %.

An n-type transistor and a p-type transistor are required to configure a CMOS transistor. In this case, an electron and a hole are used as a carrier. When Si is used as a material in an active region, the mobility of the hole is lower than the mobility of the electron. Thus, the performance of the p-type transistor is relatively lower than that of the n-type transistor.

In order to supplement the performance of the p-type transistor, a process, in which SiGe, instead of Si, is used in the active region, is applied to the p-type transistor region. The mobility of the hole is 450 and 1900 $cm^2/V \cdot s$ in pure Si and pure Ge, respectively, and SiGe has a value corresponding to stoichiometry thereof.

Also, in order to configure the p-type transistor, after SiGe is formed through epitaxial growth, a desired impurity having a desired concentration is implanted with a desired depth using ion implantation. It has been found that in the p-type transistor, when a p-type impurity is ion-implanted into an LDD region and source/drain regions and the content of Ge in SiGe that constitutes the active region is sufficiently high, for example, when Ge exceeds 50 atomic percent, a degree of activation of Ga is higher than that of B within the same 3-group element.

Thus, when Ga having a relatively high degree of activation is used as an impurity in the p-type transistor, a low resistance may be implemented compared to the case where B within the same dose is implanted, so that speed characteristics of the p-type transistor may be improved and accordingly, characteristics of a semiconductor device may be improved.

In order to check the result in a SiGe layer, a sheet resistance Rs was measured according to a dose of B and a dose of Ga in the SiGe layer that includes Ge of about 55 at %, respectively. The dose of B and the dose of Ga were written in a log scale.

As illustrated in FIG. 12, the dose of Ga is smaller than the dose of B so that an equivalent sheet resistance Rs is shown. In detail, in order to attain a sheet resistance Rs having a value of about 4100 Ω/sq., a required dose of B is about 2E14 $atoms/cm^2$, and when Ga having the same dose is doped, the sheet resistance Rs may have a value of about 2000 Ω/sq.

That is, when the dose of Ga and the dose of B are the same, values of sheet resistance Rs may be different from each other by twice or more. The sheet resistance Rs having a low value is an index that indirectly indicates that the mobility of a hole is improved. Thus, even when an impurity is implanted with the same dose, speed characteristics of the p-type transistor may be improved when Ga is doped.

Thus, when SiGe that includes Ge in excess of 50 atomic percent is used in an active region in the p-type transistor, if Ga among the Group 3 element is used as an impurity, same or higher improvements in the mobility of the hole may be expected with a lower dose compared to the case where B is used as an impurity. As a result, speed characteristics of the p-type transistor may be improved, and accordingly, characteristics of the semiconductor device may be improved.

Figure 13:
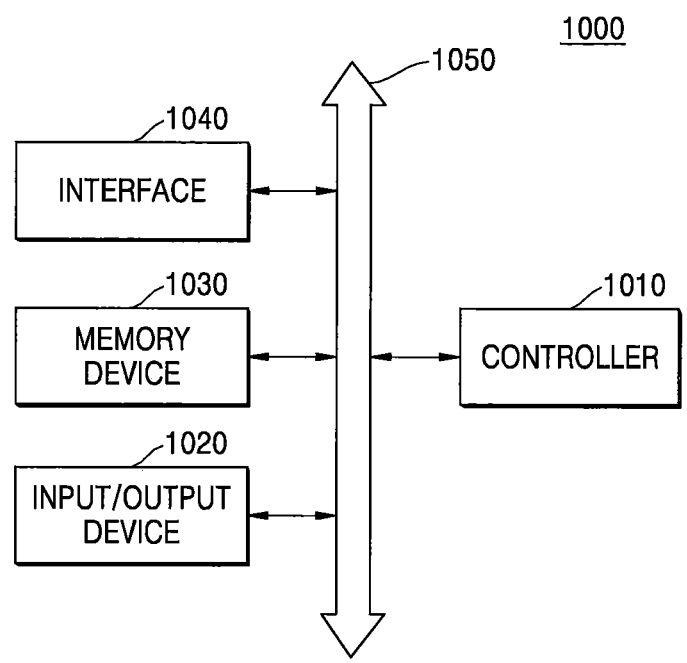
FIG. 13 is a view of a configuration of a system including the semiconductor device according to aspects of the present disclosure.

FIG. 13 is a view of a configuration of a system including the semiconductor device according to aspects of the present disclosure.

Referring to FIG. 13, a system 1000 includes a controller 1010, an input/output device 1020, a memory device 1030, an interface 1040, and a bus 1050.

The system 1000 may be a mobile system or a system for transmitting or receiving information. In some embodiments, the mobile system may be a portable computer, a web tablet, a mobile phone, a digital music player, a memory card, or the like.

The controller 1010 for controlling an execution program in the system 1000 may be a microprocessor, a digital signal processor, a microcontroller, or a similar device.

The input/output device 1020 may be used to input or output data of the system 1000. The system 1000 may be connected to an external device, for example, a personal computer or a network, or may exchange data with the external device using the input/output device 1020. The input/output device 1020 may be a touch pad, a keyboard, or a display device.

The memory device 1030 may store data for an operation of the controller 1010 or data processed by the controller 1010. The memory device 1030 may include the semiconductor device 10 according to the above-described embodiments of the inventive concepts provided herein.

The interface 1040 may be a data transmission path between the system 1000 and the external device. The controller 1010, the input/output device 1020, the memory device 1030, and the interface 1040 may communicate with each other via the bus 1050.

While inventive concepts have been particularly shown and described with reference to embodiments thereof, it will be understood that various changes in form and details may be made therein without departing from the scope of the following claims.

What is claimed is:

1. A semiconductor device comprising:
a substrate comprising first and second transistor regions and comprising a first material;
a first active region in the first transistor region; and
a second active region in the second transistor region and comprising source/drain regions, a lightly doped drain (LDD) region, and a channel region,
wherein:
an upper region of the first active region comprises a first epitaxial growth layer comprising the first material,
an upper portion of the second active region comprises a second epitaxial growth layer that comprises a second material in excess of 50 atomic percent (at %),
the second material is germanium (Ge),
the second material is different from the first material,
the source/drain regions and the LDD region are doped with gallium (Ga),
a first dose of Ga in the LDD region is lower than a second dose of Ga in the source/drain regions, and a top surface of each of the first and second active regions is flat.

2. The semiconductor device of claim 1, wherein a lattice constant of the second epitaxial growth layer is larger than a lattice constant of the substrate.

3. The semiconductor device of claim 1, wherein the second epitaxial growth layer is strained with lattice mismatch.

4. The semiconductor device of claim 2, wherein the second epitaxial growth layer comprises silicon germanium (SiGe) that is tension-strained.

5. The semiconductor device of claim 1, wherein the second dose of Ga in the source/drain regions is 5E13 to 5E15 atoms/cm$^2$.

6. The semiconductor device of claim 1, wherein the first dose of Ga in the LDD region is 1E13 to 2E15 atoms/cm$^2$.

7. The semiconductor device of claim 1, wherein the second epitaxial growth layer has a constant thickness in the source/drain regions, the LDD region, and the channel region.

8. The semiconductor device of claim 1, further comprising a gate structure on the channel region,
wherein the gate structure is a planar structure.

9. The semiconductor device of claim 8, wherein the gate structure comprises a high-k dielectric gate insulating layer and a metal gate electrode.

10. The semiconductor device of claim 1, the substrate further comprising a field region that defines the second active region,
wherein the field region is a shallow trench isolation region.

11. The semiconductor device of claim 10, wherein a top surface of the shallow trench isolation region and a top surface of the second epitaxial growth layer are substantially coplanar.

* * * * *